United States Patent
Liu et al.

(10) Patent No.: US 6,734,053 B2
(45) Date of Patent: May 11, 2004

(54) EFFECTIVE MIM FABRICATION METHOD AND APPARATUS TO AVOID BREAKDOWN AND LEAKAGE ON DAMASCENE COPPER PROCESS

(75) Inventors: Chung-Shi Liu, Hsin-Chu (TW); Chen-Hua Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 101 days.

(21) Appl. No.: 10/102,255

(22) Filed: Mar. 20, 2002

(65) Prior Publication Data

US 2003/0180993 A1 Sep. 25, 2003

(51) Int. Cl.$^7$ .......................................... H01L 21/8234
(52) U.S. Cl. ........................................ 438/197; 438/197
(58) Field of Search .................................. 438/197, 420, 438/579, 158, 396, 253, 316, 240, 686, 238, 30, 239, 260, 166

(56) References Cited

PUBLICATIONS

Liu et al, Single Mask Metal Insulator Metal (MIM) Capacitor with Copper Damascene Metallization for Sub 0.18 micrometer Mixed Mode Signal and Systemon a chip (SoC) Applications Jun. 2000, IEEE, 2000 Edition, pp. 111–113.*

* cited by examiner

Primary Examiner—Kamand Cuneo
Assistant Examiner—Monica D. Harrison
(74) Attorney, Agent, or Firm—Tung & Associates

(57) ABSTRACT

A method and apparatus for forming a metal-insulator-metal device that avoids breakdown and leakage due to semiconductor damascene copper fabrication processes associated with the formation of the metal-insulator-metal device. An extra pattern for forming a metal-insulator-metal device can be defined to remove an outer top electrode area associated with the metal-insulator-metal device. The metal-insulator-metal device can be formed without the outer top electrode area to avoid recesses in an insulator layer thereof and achieve a final metal-insulator-metal device structure that avoids breakdown and leakage as a result of associated damascene copper processes.

20 Claims, 1 Drawing Sheet

US 6,734,053 B2

EFFECTIVE MIM FABRICATION METHOD AND APPARATUS TO AVOID BREAKDOWN AND LEAKAGE ON DAMASCENE COPPER PROCESS

TECHNICAL FIELD

The present invention relates generally to semiconductor fabrication techniques and devices thereof. The present invention also relates to MIM structures and devices thereof. The present invention additionally relates to recesses formed on MIM structures. The present invention also relates to methods and devices for avoiding breakdown and leakage in MIM structures. The present invention additionally relates to damascene processes and devices thereof.

BACKGROUND OF THE INVENTION

Metal-insulator-metal fabrication technology is widely used in the fabrication of semiconductor integrated circuit devices. Metal-insulator-metal (MIM) capacitors, for example, are commonly utilized in high performance applications of CMOS technology. A typical MIM capacitor possesses a sandwich structure that can generally be described as a parallel plate capacitor. The capacitor top metal (CTM) is separated from the capacitor bottom metal (CBM) by a thin insulating layer. Both parallel plates are conventionally made from Al or AlCu alloys. These metals are patterned and etched needing several photolithography photo masking steps. The thin insulating dielectric layer is usually made from silicon oxide or silicon nitride deposited by chemical vapor deposition (CVD).

Such MIM capacitors are generally utilized in semiconductor devices, such as integrated circuits (ICs) for storing an electrical charge. In ICs, such as dynamic random access memory (DRAM), capacitors are used for storage in the memory cells. Typically, capacitors formed in ICs include a lower electrode made of, e.g., polycrystalline silicon (polysilicon), a dielectric layer made of, e.g., tantalum pentoxide and/or barium strontium titanate, and an upper electrode made of, e.g., titanium nitride, titanium, tungsten, platinum or polysilicon.

MIM capacitors can be formed utilizing damascene fabrication technology, which well known in the semiconductor fabrication arts. The damascene processing is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

Note generally that the term "damascene process" or "damascene processes" is utilized herein to refer to a standard semiconductor fabrication processes. In the processing sequence known in the art as the "Damascene Process", a dielectric layer can be patterned using known techniques such as the use of a photoresist material, which is exposed to define the wiring pattern. After developing, the photoresist acts as a mask through which a pattern of the dielectric material is removed by a subtractive etch process such as plasma etching or reactive ion etching. This is generally termed a lithography or photolithography process or operation and may be used for both additive or subtractive metallization procedures as is known in the art.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses (i.e., recesses) can be formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, wire metallization layers can be deposited, then planarized using CMP. The resulting interconnects are produced with fewer process steps than with conventional processing and with the dual damascene process, two layer of metal are formed as one, i.e., wiring line and contact stud vias, avoiding an interface between the layers.

Another metal deposition technique, besides the aforementioned sputtering techniques, has been adapted as a standard for copper metallization. This technique is referred to generally as the electrochemical deposition (ECD) of copper. The electrochemical copper deposition (ECD) requires, e.g., sputtering techniques, physical vapor deposition (PVD), to deposit thin underlying diffusion barrier film (Ta, TaN) and a conductive "seed" layer of copper.

One of the primary problems encountered during MIM fabrication processes, particular copper damascene processes, involves the formation of recesses or film notches during device fabrication. For example, recesses between TaN and copper interfaces in MIM devices following copper CMP can lead easily to MIM breakdown and leakage due to the presence of such recesses. In an oxide layer of an MIM device, for example, a recess can lead to breakdown of the oxide layer. The present inventors have thus concluded based on the foregoing that a need exists for an apparatus and method which can effectively prevent the formation of such recesses. The present invention disclosed herein addresses this important need.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and apparatus.

It is yet another aspect of the present invention to provide an improved metal-insulator-metal (MIM) fabrication method and apparatus.

It is still another aspect of the present invention to provide an improved MIM device structure that avoids breakdowns and leakages associated with damascene copper processes.

It is also an aspect of the present invention to provide an MIM capacitor which is formed based on an extra pattern in which an outer top electrode area is removed to avoid overlapping of a recessed bottom electrode area to achieve a final MIM capacitor structure.

The above and other aspects of the present invention can thus be achieved as is now described. A method and apparatus are disclosed herein for forming a metal-insulator-metal device that avoids breakdown and leakage due to semiconductor damascene copper fabrication processes associated with the formation of the metal-insulator-metal device. An extra pattern may be defined for forming a metal-insulator-metal device to remove an outer top electrode area associated with the metal-insulator-metal device and avoid recesses in an insulating layer thereof.

The metal-insulator-metal device is thus generally formed without the outer top electrode area, such that an area previously associated with the outer top electrode area overlaps a recessed bottom electrode area of the metal-insulator-metal device to achieve a final metal-insulator-metal device structure that avoids breakdown and leakage as a result of associated damascene copper processes. Essentially, an initial pattern may be defined for forming the metal-insulator device, and thereafter the extra pattern can be defined.

The metal-insulator-metal device generally can comprise metal-insulator-metal capacitor. The metal-insulator-metal device can be formed utilizing at least one TaN layer and at least one copper layer. A first TaN layer may be deposited upon a substrate followed by a dielectric layer upon the substrate to form the metal-insulator-metal device and a second TaN layer to form the metal-insulator-metal device.

The extra pattern described herein can be generally defined to remove only the outer top electrode area associated with the metal-insulator-metal device. Such an extra pattern can also be defined to remove at least one film notch associated with the formation of the metal-insulator-metal device. Finally, the extra pattern can be defined to remove at least one recess associated with the formation of the metal-insulator-metal device. The extra pattern is thus defined to remove the outer top electrode area only, wherein the area overlaps the recessed bottom electrode area. Formation of the capacitor is thus controlled at the area where a recess profile is not included, thereby avoiding MIM structure breakdown and leakage.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
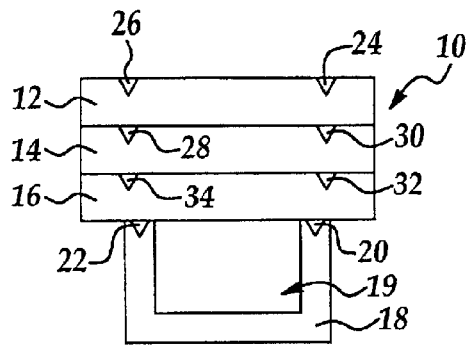
FIG. 1 illustrates a block diagram of a prior art MIM structure which is faced with film notch and chemical corrosion issues.

FIG. 1 illustrates a block diagram of a prior art MIM structure 10 which is faced with film notch and chemical corrosion issues. MIM structure 10 contains a TaN layer 12, which is formed above an intermediate layer 14. Note that intermediate layer 14 may be formed as an oxide or SiN layer. A second TaN layer is located below intermediate layer 16. A diffusion layer 18 surrounds an internal layer 19, which may be formed from copper. Diffusion layer 18 can be formed from TaN.

One of the problems that prior art MIM structures, such as MIM structure, can encounter is the formation of recesses, such as recesses 24, 26, 28, 30, 32, and 24. Such recesses between TaN and copper interfaces after copper chemical mechanical polishing (CMP) can easily lead to MIM breakdown due to recess formation on the MIM structure. Such recesses or notches (i.e., film notches) are illustrated as V-shaped recesses in FIG. 1. In particular, the intermediate layer 14, which may be formed from oxide or SiN, can break down.

Corrosion can occur at recesses 22 and 20 as a result of the formation of MIM structure 10. MIM structure 10 is generally formed as a result copper damascene processes. Thus, a need exists to avoid breakdown and leakage in an MIM structure as a result of the formation of V-shaped recesses and/or notches, and associated corrosion thereof.

Figure 2:
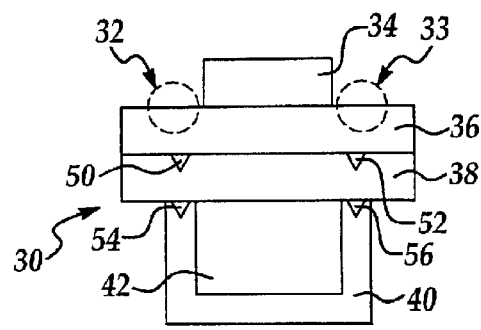
FIG. 2 depicts a block diagram of an MIM structure that can be formed in accordance with a preferred embodiment of the present invention.

FIG. 2 depicts a block diagram of an MIM structure 32 that can be formed in accordance with a preferred embodiment of the present invention. Generally, MIM structure 30 is designed to avoid the V-shaped recesses evident in MIM structure 10 of FIG. 1. An extra pattern may be defined for forming a MIM structure 34 (i.e., a metal-insulator-metal device) to remove an outer top electrode area associated with the MIM structure and thus remove the V-shaped recesses, as indicated at area 32.

Note that area 32 is generally illustrated as a dashed circle to indicate the face that the V-shaped recess previously indicated in MIM structure 10 of FIG. 1 is not present in MIM structure 30 of FIG. 2. This also holds true for area 33 of FIG. 2. MIM structure 30 thus includes a metal layer 34 (i.e., M) an insulator layer 35 (i.e., I), and a metal layer 38 (i.e., M). Hence, layers 34, 36, and 38 generally form an MIM structure. MIM structure 30 also is associated with an internal copper layer 42 and a diffusion layer 40, which can be formed from TaN.

Layer 34 can be formed from TaN, while layer 36 can be formed from oxide or SiN. Additionally, layer 38 can be formed from TaN. Note that recesses 50, 52 and 54, 56 are present in MIM structure 30, however, such recesses or film notches do not pose a problem because recesses formed in the metal layer are sufficient to permit a flow of current that would otherwise breakdown if such recesses were present in an oxide or SiN layer. Thus, such recesses are not present in layer 36 (i.e., oxide or SiN).

Figure 3:
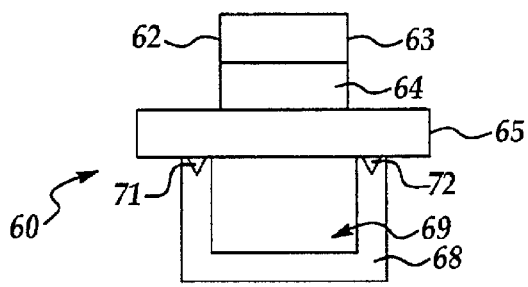
FIG. 3 illustrates a block diagram of an MIM structure that can be formed in accordance with an alternative embodiment of the present invention.

FIG. 3 illustrates a block diagram of an MIM structure 60 that can be formed in accordance with an alternative embodiment of the present invention. Extra patterns can also be defined to avoid the formation of recesses in the oxide or SiN layer of an MIM structure. FIG. 3 thus illustrates layers 63, 64, and 65 which respectively metal, insulator, and metal layers. Layer 63 is comprises a top layer 62 of the MIM structure 60 indicated in FIG. 3. However, notches or V-shaped recesses are not present in layer 64 in particular, which can comprise an oxide or SiN layer. Thus, the flow of current will not cause breakdown, as is the case with the configuration depicted in FIG. 1. MIM structure 60 also generally includes an inner copper layer 69, recesses 71, 72, and a diffusion layer 68, which may be formed from TaN. Recesses are thus avoided in an insulating layer 64 of MIM structure 60.

Figure 4:
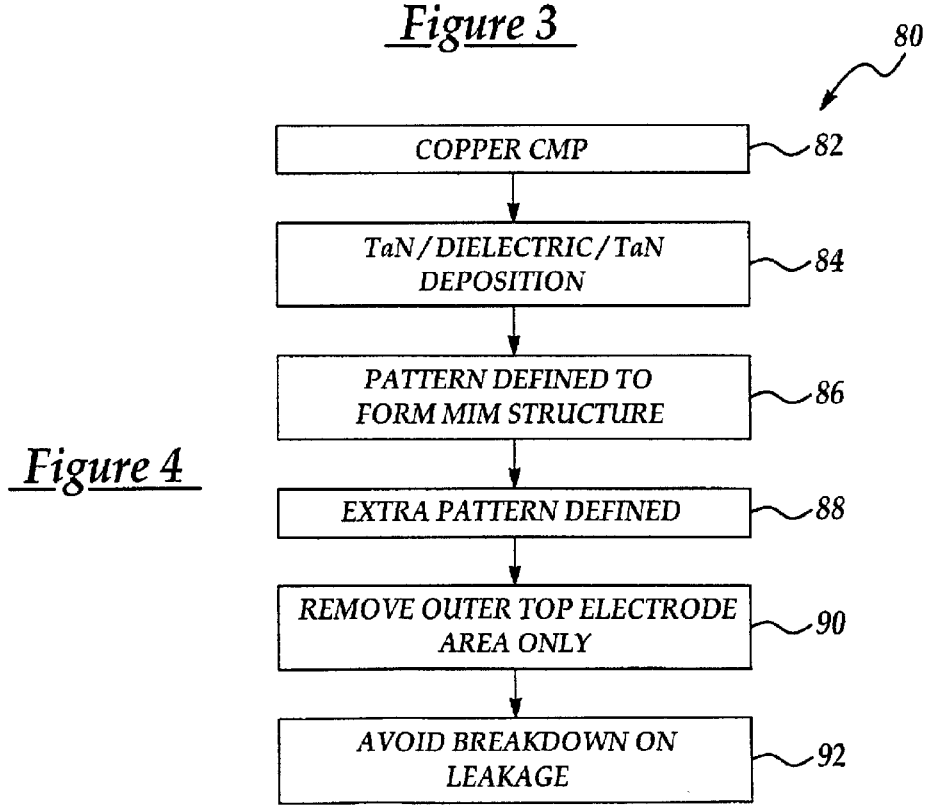
FIG. 4 depicts a high-level flow chart of operations illustrating general operational steps that can be implemented in accordance with preferred or alternative embodiments of the present invention.

FIG. 4 depicts a high-level flow chart 80 of operations illustrating general operational steps that can be implemented in accordance with preferred or alternative embodiments of the present invention. Initially, in the formation of an MIM structure utilizing copper damascene fabrication processes, a copper chemical mechanical polishing (CMP) operation can occur, as indicated at block 82. Note generally that chemical mechanical polishing is one accepted method of planarization. This planarization method typically requires that the substrate be mounted on a carrier or polishing head, with the surface of the substrate to be polished exposed.

The substrate is then placed against a rotating polishing pad. In addition, the carrier head may rotate to provide additional motion between the substrate and polishing surface. Further, a polishing slurry, including an abrasive and at least one chemically-reactive agent, may be spread on the polishing pad to provide an abrasive chemical solution at the interface between the pad and substrate. Important factors in the chemical mechanical polishing process are: the finish (roughness) and flatness (lack of large scale topography) of the substrate surface, and the polishing rate. Inadequate flatness and finish can produce substrate defects. The polishing rate sets the time needed to polish a layer. Thus, it sets the maximum throughput of the polishing apparatus.

Each polishing pad provides a surface, which, in combination with the specific slurry mixture, can provide specific polishing characteristics. Thus, for any material being polished, the pad and slurry combination is theoretically capable of providing a specified finish and flatness on the polished surface. The pad and slurry combination can provide this finish and flatness in a specified polishing time. Additional factors, such as the relative speed between the substrate and pad, and the force pressing the substrate against the pad, affect the polishing rate, finish and flatness.

Following the performance of a CMP operation, as indicate at block 82, a TaN/dielectric/TaN deposition operation can occur, as depicted at block 84. TaN is deposited on a substrate, followed by a dielectric layer, and thereafter by another TaN layer. As indicated at block 86, a pattern may generally be defined to form the MIM structure.

Thereafter, as depicted at block 88, an extra pattern may be defined. Such an extra pattern is defined, as indicated at block 90, to remove an outer top electrode area only, such that this area previously overlapped a recessed bottom electrode. Thus, such a pattern avoids the formation of recesses or film notches in the dielectric area. Multiple extra patterns can be defined to avoid the formation of additional recesses. The result of the use of such extra patterns is the avoidance of breakdown or leakage, as indicated at block 92.

Based on the foregoing, it can be appreciated that the present invention discloses a method and apparatus for forming a metal-insulator-metal device that avoids breakdown and leakage due to semiconductor damascene copper fabrication processes associated with the formation of the metal-insulator-metal device. An extra pattern may be defined for forming a metal-insulator-metal device to remove an outer top electrode area associated with the metal-insulator-metal device.

The metal-insulator-metal device is thus generally formed without the outer top electrode area, such that an area previously associated with the outer top electrode area overlaps a recessed bottom electrode area of the metal-insulator-metal device to achieve a final metal-insulator-metal device structure that avoids breakdown and leakage as a result of associated damascene copper processes. Essentially, an initial pattern may be defined for forming the metal-insulator device, and thereafter the extra pattern can be defined.

The metal-insulator-metal device generally can comprise metal-insulator-metal capacitor. The metal-insulator-metal device can be formed utilizing at least one TaN layer and at least one copper layer. A first TaN layer may be deposited upon a substrate followed by a dielectric layer upon the substrate to form the metal-insulator-metal device and a second TaN layer to form the metal-insulator-metal device.

The extra pattern is generally defined to remove only the outer top electrode area associated with the metal-insulator-metal device. The extra pattern can also be defined to remove at least one film notch associated with the formation of the metal-insulator-metal device. Finally, the extra pattern can be defined to remove at least one recess associated with the formation of the metal-insulator-metal device.

The extra pattern is thus defined to remove the outer top electrode area only, wherein the area overlaps the recessed bottom electrode area. Formation of the capacitor is thus controlled at the area where a recess profile is not included, thereby avoiding MIM structure breakdown and leakage. Thus, the formation of recesses in an insulating layer of an MIM structure are effectively avoiding through the use of an extra pattern as explained herein. In particular, such recesses or film notches can be avoided in the insulating oxide or SiN layer of an MIM structure through the use of such an extra pattern for removing the outer top electrode area only.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method, comprising the steps of:
    defining an initial pattern for initially forming a capacitor comprising a metal-insulator-metal device;
    defining an extra pattern for forming said metal-insulator-metal device to remove an outer top electrode area associated with said metal-insulator-metal device; and
    forming said metal-insulator-metal device without said outer top electrode area to avoid recesses in an insulating layer thereof and achieve a final metal-insulator-metal device structure that avoids breakdown and leakage as a result of associated damascene copper processes.

2. The method of claim 1 wherein the step of defining an initial pattern for forming a capacitor comprising a metalinsulator-metal device, further comprising the step of defining said initial pattern for forming said capacitor prior to defining said extra pattern.

3. The method of claim 1 wherein said capacitor comprises a parallel plate capacitor.

4. The method of claim 1 further comprising the step of:
forming said metal-insulator-metal device utilizing at least one TaN layer.

5. The method of claim 1 further comprising the step of:
forming said metal-insulator-metal device utilizing at least one copper layer.

6. The method of claim 1 further comprising the step of:
forming said metal-insulator-metal device utilizing at least two TaN layers.

7. The method of claim 1 further comprising the steps of:
depositing a first TaN layer upon a substrate to form said metal-insulator-metal device;
thereafter depositing a dielectric layer upon said substrate to form said metal-insulator-metal device; and
thereafter depositing a copper layer upon said substrate to form said metal-insulator-metal device.

8. The method of claim 1 wherein the step of defining an extra pattern for forming a metal-insulator-metal device to remove an outer top electrode area associated with said metal-insulator-metal device, further comprises the step of:
defining at least one extra pattern to remove only said outer top electrode area associated with said metal-insulator-metal device.

9. The method of claim 1 wherein the step of defining an extra pattern for forming a metal-insulator-metal device to remove an outer top electrode area associated with said metal-insulator-metal device, further comprises the step of:
defining said extra pattern to remove at least one film notch associated with the formation of said metal-insulator-metal device.

10. The method of claim 1 wherein the step of wherein the step of defining an extra pattern for forming a metal-insulator-metal device to remove an outer top electrode area associated with said metal-insulator-metal device, further comprises the step of:
defining said extra pattern to remove at least one recess associated with the formation of said metal-insulator-metal device.

11. An apparatus, comprising:
an initial pattern for initially forming a capacitor comprising a metal-insulator-metal device;
an extra pattern defined for forming said metal-insulator-metal device to remove an outer top electrode area associated with said metal-insulator-metal device; and
wherein said metal-insulator-metal device is formed without said outer top electrode area to avoid recesses formed in an insulating layer of said metal-insulator device to achieve a final metal-insulator-metal device structure that avoids breakdown and leakage as a result of associated damascene copper processes.

12. The apparatus of claim 11 wherein said initial pattern is defined prior to said extra pattern.

13. The apparatus of claim 11 wherein said capacitor comprises a parallel plate capacitor.

14. The apparatus of claim 11 wherein said metal-insulator-metal device is formed utilizing at least one TaN layer.

15. The apparatus of claim 11 wherein said metal-insulator-metal device is formed utilizing at least one copper layer.

16. The apparatus of claim 11 wherein said metal-insulator-metal device is formed utilizing at least two TaN layers.

17. The apparatus of claim 11 further comprising:
a first TaN layer deposited upon a substrate to form said metal-insulator-metal device;
a dielectric layer deposited upon said substrate to form said metal-insulator-metal device; and
a copper layer deposited on said substrate to form said metal-insulator-metal device.

18. The apparatus of claim 11 wherein said extra pattern is defined to remove only said outer top electrode area associated with said metal-insulator-metal device.

19. The apparatus of claim 11 wherein said extra pattern is defined to remove at least one film notch associated with the formation of said metal-insulator-metal device.

20. The apparatus of claim 11 wherein said extra pattern is defined to remove at least one recess associated with the formation of said metal-insulator-metal device.

* * * * *